(12) United States Patent
Huang et al.

(10) Patent No.: US 12,249,980 B2
(45) Date of Patent: Mar. 11, 2025

(54) CIRCUIT AND METHOD FOR IMPROVING EFFICIENCY BY USE OF EXTERNAL INDUCTOR FOR TEMPERATURE CONTROL

(71) Applicant: Potens Semiconductor Corp., Hsinchu County (TW)

(72) Inventors: Wen Nan Huang, Hsinchu County (TW); Ching Kuo Chen, Hsinchu County (TW); Shiu Hui Lee, Hsinchu County (TW); Hsiang Chi Meng, Hsinchu County (TW); Chih Ming Yu, Hsinchu County (TW)

(73) Assignee: POTENS SEMICONDUCTOR CORP., Zhubei (TW)

(*) Notice: Subject to any disclaimer, the term of this patent is extended or adjusted under 35 U.S.C. 154(b) by 84 days.

(21) Appl. No.: 18/222,668

(22) Filed: Jul. 17, 2023

(65) Prior Publication Data

US 2024/0223184 A1    Jul. 4, 2024

(30) Foreign Application Priority Data

Dec. 26, 2022  (TW) ................... 111150041

(51) Int. Cl.
| | | |
|---|---|---|
| H03K 17/00 | (2006.01) | |
| H03F 3/45 | (2006.01) | |
| H03K 17/10 | (2006.01) | |
| H03K 17/14 | (2006.01) | |
| H03K 17/567 | (2006.01) | |
| H03K 17/64 | (2006.01) | |
| H03K 17/73 | (2006.01) | |

(52) U.S. Cl.
CPC ....... *H03K 17/567* (2013.01); *H03F 3/45475* (2013.01); *H03K 17/10* (2013.01); *H03K 17/14* (2013.01); *H03K 17/64* (2013.01); *H03K 17/731* (2013.01)

(58) Field of Classification Search
CPC ...... H03K 17/567; H03K 17/10; H03K 17/14; H03K 17/64; H03K 17/731; H03F 3/45475
See application file for complete search history.

(56) References Cited

U.S. PATENT DOCUMENTS

| | | | |
|---|---|---|---|
| 9,584,033 B1* | 2/2017 | Huang | H02M 3/33507 |
| 2009/0160368 A1* | 6/2009 | Godbole | H05B 45/3725 |
| | | | 327/108 |
| 2017/0108557 A1* | 4/2017 | Huang | G01R 31/42 |
| 2023/0039285 A1* | 2/2023 | Huang | H03K 17/687 |
| 2024/0007103 A1* | 1/2024 | Yamada | H03K 17/0822 |

* cited by examiner

*Primary Examiner* — Tuan T Lam
(74) *Attorney, Agent, or Firm* — Muncy, Geissler, Olds & Lowe, P.C.

(57) ABSTRACT

A circuit and a method for improving efficiency by use of external inductor for temperature control, wherein the operating temperature of a field effect transistor is calculated by the inductor voltage. The change in operating temperature is used to adjust and control the voltage of the variable voltage gate drive module. When the operating temperature rises, the input voltage of the gate increases accordingly; when the operating temperature decreases, the input voltage of the gate decreases accordingly, thereby achieving the efficiency of regulating light and heavy loads.

10 Claims, 3 Drawing Sheets

CIRCUIT AND METHOD FOR IMPROVING EFFICIENCY BY USE OF EXTERNAL INDUCTOR FOR TEMPERATURE CONTROL

BACKGROUND OF INVENTION

(1) Field of the Present Disclosure

The present disclosure relates to a circuit and a method for improving efficiency by use of external inductor for temperature control.

(2) Brief Description of Related Art

Nowadays, current sensors are mostly used to detect the change of the transistor current, thereby detecting the temperature of the MOSFET to regulate the circuit. However, the current sensor is expensive. Therefore, how to employ a lower cost method for detecting the MOSFET temperature and regulating the circuit is a problem to be resolved.

SUMMARY OF INVENTION

It is a primary object of the present disclosure to provide a circuit and a method for improving efficiency by use of external inductor for temperature control.

According to the present disclosure, an inductor is connected in parallel with a drain of a field effect transistor. Meanwhile, a voltage signal of the inductor is captured through a differential amplifier module and sending it to a microprocessing unit. Thereafter, the voltage signal is converted into a current signal through integration by use of the microprocessing unit. Then, a power consumption of the field effect transistor is calculated based on the current signal or estimated by a lookup table. Moreover, an operating temperature of the field effect transistor is estimated based on the power consumption while an input voltage of a gate of the field effect transistor is regulated by a variable voltage gate drive module based on the operating temperature. In this way, the external inductor of the present disclosure can be employed to provide the temperature information of the field effect transistor to the microprocessing unit, so as to provide a reference for the judgment of the circuit operation, thereby improving the efficiency of the MOSFET, such as performance optimization, efficiency improvement, motor speed prediction, etc. Meanwhile, the electromagnetic interference generated by electronic circuits can be improved.

DETAILED DESCRIPTION OF PREFERRED EMBODIMENTS

Figure 1:
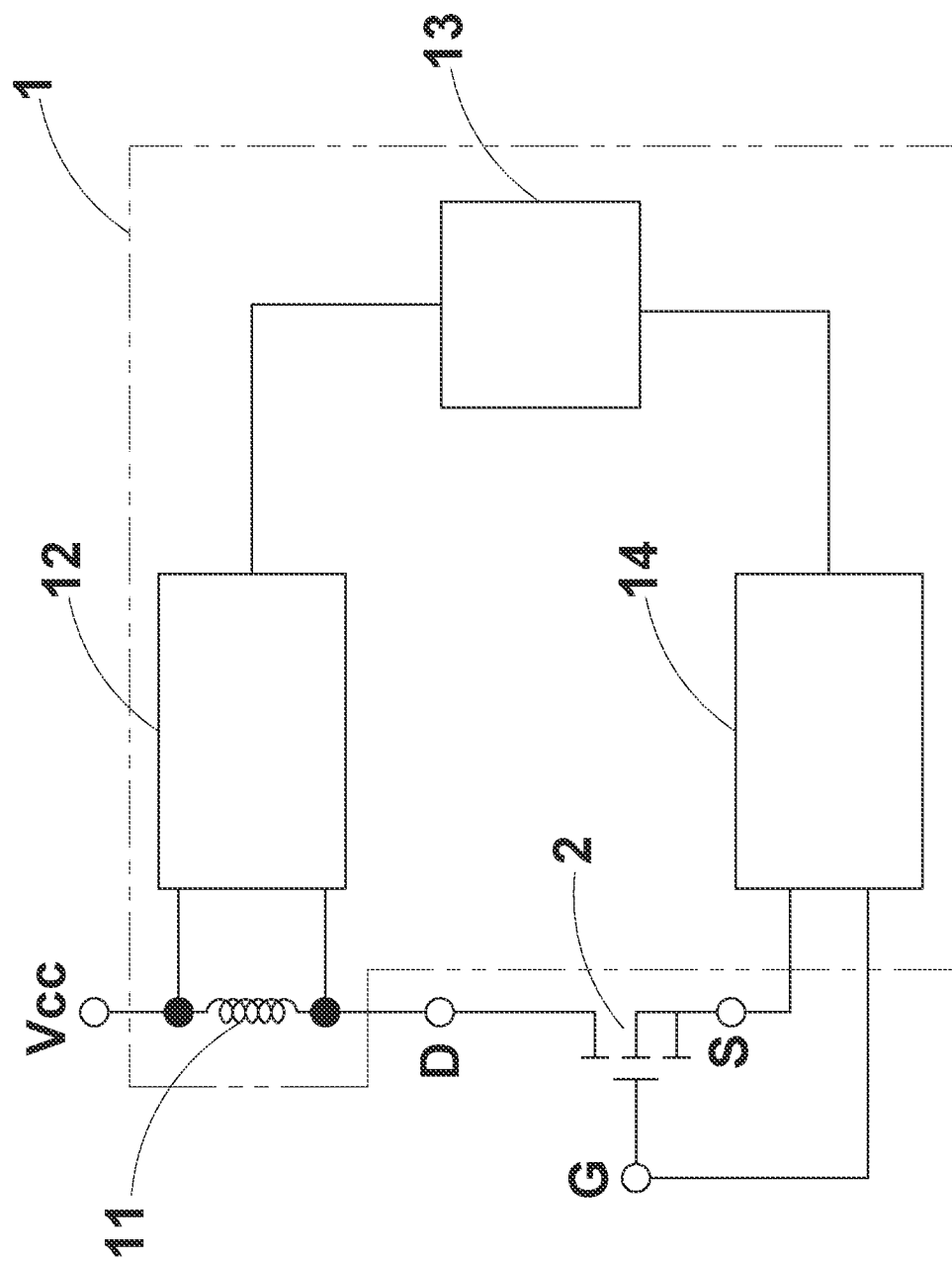
FIG. 1 is a block diagram of a circuit according to the present disclosure.

Referring to FIG. 1, a circuit for improving efficiency 1 by use of temperature control is electrically connected to a field effect transistor 2 and may include an inductor 11, a differential amplifier module 12, a microprocessing unit 13, and a variable voltage gate drive module 14. The inductor 11 can be a bead core or an inductor in a circuit, but not limited thereto. The microprocessing unit 13 can be a microcontroller (MCU) or a control IC.

Figure 2:
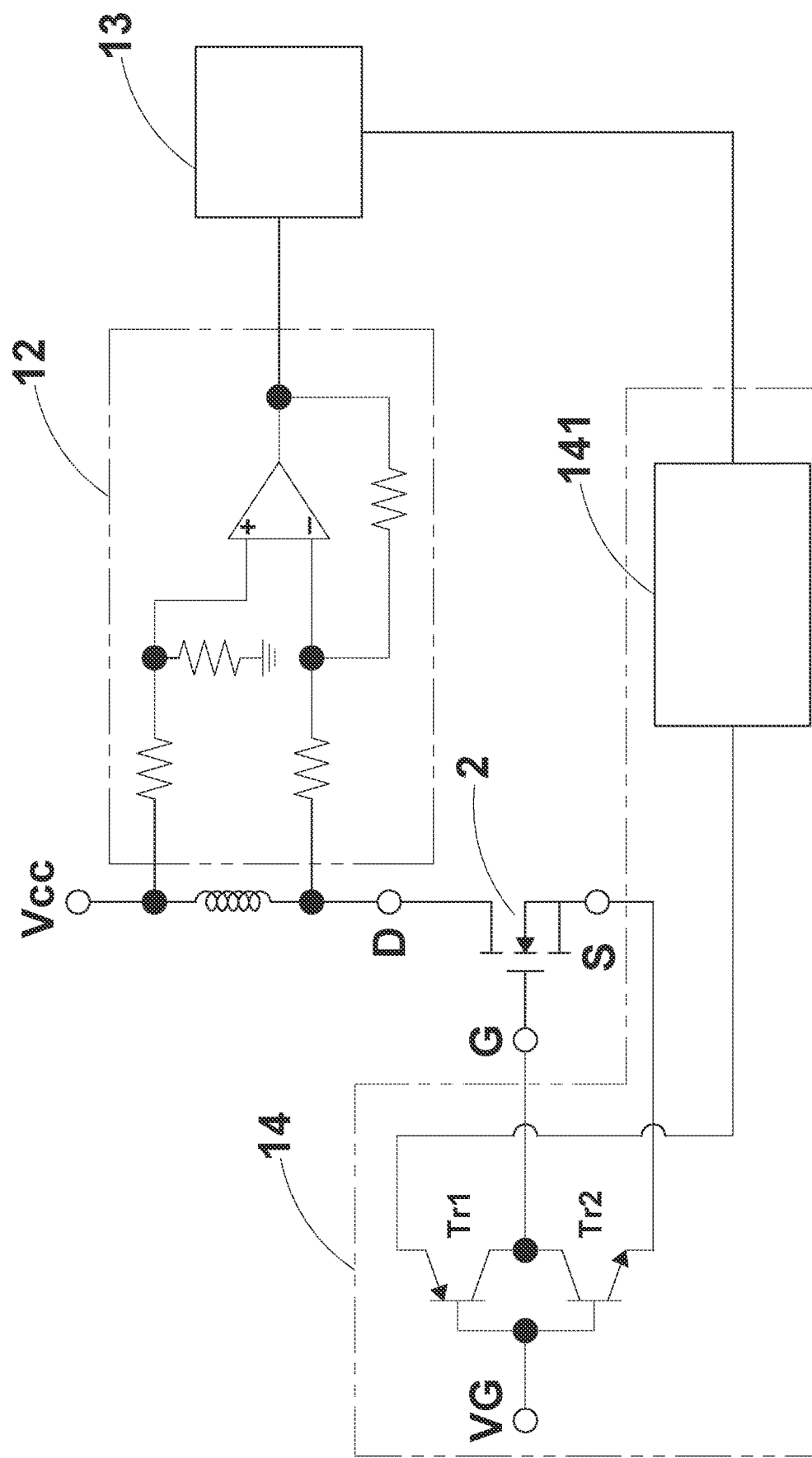
FIG. 2 is control circuit diagram according to the present disclosure.

Referring to FIG. 2, one end of the inductor 11 is electrically connected to a drain D of the field effect transistor 2, and the other end thereof is electrically connected to a power supply voltage $V_{CC}$.

One end of the differential amplifier module 12 is connected in parallel to the inductor 11 while the other end thereof is electrically connected to the microprocessing unit 13 to amplify the voltage of the inductor 11 and transmit it to the microprocessing unit 13.

One end of the microprocessing unit 13 is electrically connected to the differential amplifier module 12 while the other end thereof is electrically connected to the variable voltage gate drive module 14 to convert the voltage obtained from the inductor 11 into the electric current. The power consumption and the operating temperature of the field effect transistor 2 are estimated based on current calculation or by use of a lookup table. Meanwhile, the output voltage of the variable voltage gate drive module 14 is adjusted and controlled according to the change of the operating temperature.

The variable voltage gate drive module 14 includes a buck-boost conversion unit 141, a first transistor Tr1, and a second transistor Tr2. The first transistor Tr1 and the second transistor Tr2 can be a PNP type transistor or an NPN type transistor, but not limited thereto. Preferably, the first transistor Tr1 is a PNP type transistor, and the second transistor Tr2 is an NPN transistor. Moreover, one end of the buck-boost conversion unit 141 is electrically connected to the microprocessing unit 13, and the other end thereof is electrically connected to the emitter of the first transistor Tr1. The collector of the first transistor Tr1 is electrically connected to the gate G of the field effect transistor 2 and the collector of the second transistor Tr2. The gate of the first transistor Tr1 is electrically connected to a gate signal source $V_G$. The collector of the second transistor Tr2 is electrically connected to the gate G of the field effect transistor 2. The collector of the second transistor Tr2 is electrically connected to the source of the field effect transistor 2. The gate of the second transistor Tr2 is electrically connected to the gate signal source VG.

Figure 3:
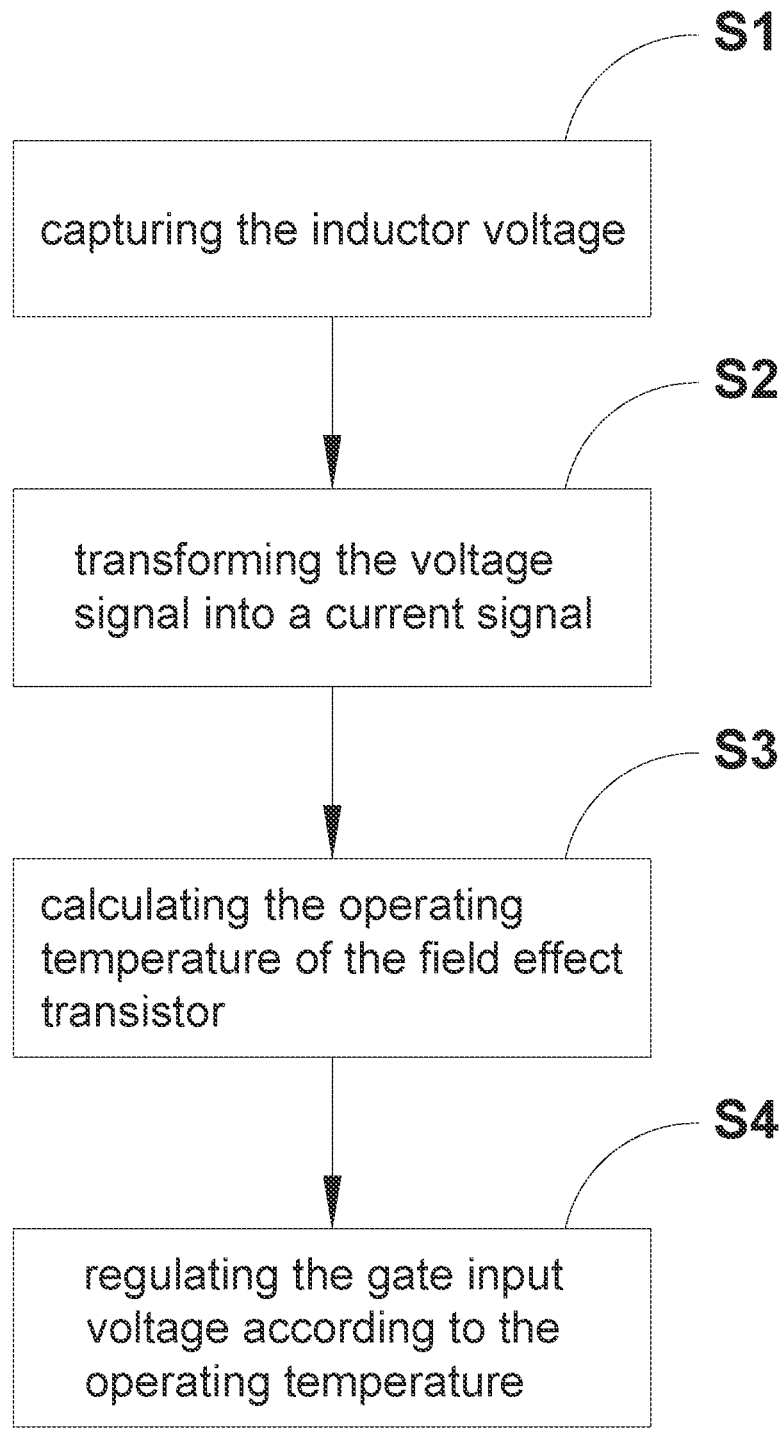
FIG. 3 is a flow chart of the present disclosure.

FIG. 3 shows the control method for suppressing electromagnetic interference of the present disclosure, the steps are detailed as follows:

Step S1 of capturing the inductor voltage: a voltage signal of the inductor 11 is captured by the differential amplifier module 12 and sent to the microprocessing unit 13, wherein the inductor 11 is electrically connected to the drain D of the field effect transistor 2.

Step S2 of transforming the voltage signal into a current signal: the microprocessing unit 13 uses the following formula (1) to convert the voltage signal obtained from the inductor 11 into a current signal through integration.

$$I(t) = \frac{1}{L} \int V_L(t)dt \quad (1)$$

wherein L in the formula (1) is the inductor value, and $V_L$ is the inductor voltage.

Step S3 of calculating the operating temperature of the field effect transistor: A formula (2) is employed to calculate the power consumption of the field effect transistor 2 based on the current signal by the microprocessing unit 13. Thereafter, a formula (3) is employed to calculate the operating temperature of the field effect transistor 2 based on the power consumption.

$$P = I^2 \times R_{ON} \tag{2}$$

wherein P in the formula (2) is the power consumption of the field effect transistor, I is the inductor current, and $R_{ON}$ is the on-resistance of the field effect transistor.

$$T = P \times R_{\theta JA} \tag{3}$$

wherein T in the formula (3) is the operating temperature of the field effect transistor, and $R_{\theta JA}$ is the thermal resistance value between the junction of the field effect transistor and the air.

In one embodiment of the present disclosure, the micro-processing unit 13 estimates the power consumption and the operating temperature of the field effect transistor 2 by using a lookup table based on the current signal.

Step S4 of regulating the gate input voltage according to the operating temperature: the micro-processing unit 13 controls the variable voltage gate drive module 14 to regulate an input voltage input to the gate of the field effect transistor 2 based on the operating temperature of the field effect transistor 2. In further detail, when the operating temperature of the field effect transistor 2 becomes higher, the buck-boost conversion unit 141 increases the output voltage, that is, the input voltage of the gate is increased, thereby reducing the on-resistance of the field effect transistor 2 to improve the heavy load efficiency. To the contrary, when the operating temperature of the field effect transistor 2 becomes lower, the buck-boost conversion unit 141 reduces the output voltage, that is, the input voltage of the gate is reduced, thereby lowering the gate drive loss of the field effect transistor 2 to improve light loading efficiency.

According to the present disclosure, the operating temperature of the field effect transistor is calculated based on the inductor voltage. Meanwhile, the voltage of the variable voltage gate drive module is adjusted and controlled in accordance with the change of the operating temperature. When the operating temperature rises, the input voltage of the gate rises accordingly. When the operating temperature drops, the input voltage of the gate decreases accordingly. In this way, the efficiency of regulating light and heavy loads is improved. Accordingly, after the present disclosure is implemented, it is indeed possible to provide a replacement for the conventional current sensor. In other words, the purpose of detecting the temperature of the MOSFET and regulating the circuit is achieved in a cost-effective manner.

REFERENCE SIGN 1 circuit for improving efficiency by use of temperature control
11 inductor
12 differential amplifier module
13 microprocessing unit
14 variable voltage gate drive module
141 buck-boost conversion unit
2 field effect transistor
D drain
G gate
S source
Tr1 first transistor
Tr2 second transistor
$V_{cc}$ power supply voltage
$V_g$ gate signal source
S1 capturing the inductor voltage
S2 transforming the voltage signal into a current signal
S3 calculating the operating temperature of the field effect transistor
S4 regulating the gate input voltage according to the operating temperature

What is claimed is:

1. A circuit for improving efficiency by use of temperature control, electrically connected to a field effect transistor, comprising:
    an inductor electrically connected to a drain of the field effect transistor;
    a differential amplifier module connected in parallel with the inductor to capture a voltage signal of the inductor;
    a microprocessing unit connected to the differential amplifier module for converting the voltage signal in a current signal through integration, wherein the microprocessing unit calculates a power consumption of the field effect transistor and an operating temperature of the field effect transistor based on the power consumption; and
    a variable voltage gate drive module electrically connected to the microprocessing unit and a gate and a source of the field effect transistor for regulating an input voltage of the gate based on the operating temperature.

2. The circuit for improving efficiency by use of temperature control as claimed in claim 1, wherein the variable voltage gate drive module includes a buck-boost conversion unit, and wherein, when the operating temperature becomes higher, the buck-boost conversion unit increases the input voltage, and when the operating temperature becomes lower, the buck-boost conversion unit lowers the input voltage.

3. The circuit for improving efficiency by use of temperature control as claimed in claim 2,
    wherein the variable voltage gate drive module includes a first transistor and a second transistor;
    wherein the collector of the first transistor and the collector of the second transistor are electrically connected to the gate of the field effect transistor;
    wherein the gate of the first transistor and the gate of the second transistor are electrically connected to a gate signal source; and
    wherein the emitter of the first transistor is electrically connected to the buck-boost conversion unit, and the emitter of the second transistor is electrically connected to the source of the field effect transistor.

4. The circuit for improving efficiency by use of temperature control as claimed in claim 3, wherein the first transistor and the second transistor are selected from a group consisting of a PNP type transistor and an NPN type transistor.

5. The circuit for improving efficiency by use of temperature control as claimed in claim 1, wherein the power consumption and the operating temperature of the field effect transistor are estimated by the microprocessing unit through a lookup table based on the current signal.

6. A method for improving efficiency by use of temperature control, electrically connected to a field effect transistor, comprising:
    connecting an inductor in parallel with a drain of a field effect transistor;
    capturing a voltage signal of the inductor through a differential amplifier module and sending it to a microprocessing unit;

converting the voltage signal into a current signal through integration by use of the microprocessing unit, calculating a power consumption of the field effect transistor based on the current signal, and estimating an operating temperature of the field effect transistor based on the power consumption; and regulating an input voltage of a gate of the field effect transistor by a variable voltage gate drive module based on the operating temperature.

7. The method for improving efficiency by use of temperature control as claimed in claim 6, wherein the variable voltage gate drive module includes a buck-boost conversion unit, and wherein, when the operating temperature becomes higher, the buck-boost conversion unit increases the input voltage, and when the operating temperature becomes lower, the buck-boost conversion unit lowers the input voltage.

8. The method for improving efficiency by use of temperature control as claimed in claim 7, wherein the variable voltage gate drive module includes a first transistor and a second transistor;

wherein a collector of the first transistor and a collector of the second transistor are electrically connected to the gate of the field effect transistor;

wherein the gate of the first transistor and a gate of the second transistor are electrically connected to a gate signal source; and wherein the emitter of the first transistor is electrically connected to the buck-boost conversion unit, and the emitter of the second transistor is electrically connected to a source of the field effect transistor.

9. The method for improving efficiency by use of temperature control as claimed in claim 8, wherein the first transistor and the second transistor are selected from a group consisting of a PNP type transistor and an NPN type transistor.

10. The method for improving efficiency by use of temperature control as claimed in claim 6, wherein the power consumption and the operating temperature of the field effect transistor are estimated by the microprocessing unit through a lookup table based on the current signal.

\* \* \* \* \*